(12) United States Patent
Lou et al.

(10) Patent No.: US 11,189,684 B2
(45) Date of Patent: Nov. 30, 2021

(54) DISPLAY PANEL, DISPLAY SCREEN, AND DISPLAY TERMINAL

(71) Applicants: YUNGU (GU'AN) TECHNOLOGY CO., LTD., Langfang (CN); SUZHOU QINGYUE OPTOELECTRONICS TECHNOLOGY CO., LTD., Kunshan (CN); Kunshan Go-Visionox Opto-Electronics Co., Ltd., Kunshan (CN)

(72) Inventors: Junhui Lou, Kunshan (CN); Yanan Ji, Kunshan (CN); Leping An, Kunshan (CN); Zhengfang Xie, Kunshan (CN); Yanqin Song, Kunshan (CN)

(73) Assignees: YUNGU (GU'AN) TECHNOLOGY CO., LTD., Langfang (CN); SUZHOU QINGYUE OPTOELECTRONICS TECHNOLOGY CO., LTD, Kunshan (CN); KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 162 days.

(21) Appl. No.: 16/814,934

(22) Filed: Mar. 10, 2020

(65) Prior Publication Data

US 2020/0212163 A1 Jul. 2, 2020

Related U.S. Application Data

(63) Continuation-in-part of application No. PCT/CN2019/084678, filed on Apr. 26, 2019.

(30) Foreign Application Priority Data

Aug. 6, 2018 (CN) .......................... 201810887668.0

(51) Int. Cl.
*H01L 27/32* (2006.01)
*H01L 51/52* (2006.01)

(52) U.S. Cl.
CPC ........ *H01L 27/3286* (2013.01); *H01L 27/329* (2013.01); *H01L 27/3227* (2013.01);
(Continued)

(58) Field of Classification Search
CPC ..... H01L 27/3276–3279; H01L 27/3288–329; H01L 51/5209; H01L 51/5225
See application file for complete search history.

(56) References Cited

U.S. PATENT DOCUMENTS 8,853,936 B2 10/2014 Sugizaki et al.
2009/0128766 A1 5/2009 Kawamura et al.
(Continued)

FOREIGN PATENT DOCUMENTS

CN 103325955 A 9/2013
CN 203733797 U 7/2014
(Continued)

*Primary Examiner* — Daniel P Shook
(74) *Attorney, Agent, or Firm* — Kilpatrick Townsend & Stockton

(57) ABSTRACT

A display panel, a display screen, and a terminal device are provided. The display panel includes: a substrate; and a plurality of first electrodes disposed on the substrate, the plurality of the first electrodes extending in parallel with each other in a extending direction, and two adjacent first electrodes having an interval therebetween, a width of the first electrode changes continuously or intermittently in the extending direction of the first electrodes, two edges of the first electrode in the extending direction thereof are wavy lines, crests and troughs of the wavy line are both curves, and a radius of curvature of the curve at the crest is different from a radius of curvature of the curve at the trough.

20 Claims, 12 Drawing Sheets

(52) U.S. Cl.
CPC ...... *H01L 27/3234* (2013.01); *H01L 27/3267* (2013.01); *H01L 27/3279* (2013.01); *H01L 51/5209* (2013.01); *H01L 27/3276* (2013.01); *H01L 27/3288* (2013.01)

(56) References Cited

U.S. PATENT DOCUMENTS

| | | | |
|---|---|---|---|
| 2018/0053906 A1 | 2/2018 | Lee et al. | |
| 2018/0253175 A1 | 9/2018 | Yao | |
| 2019/0165299 A1* | 5/2019 | Bookbinder | ........ H01L 51/5209 |

FOREIGN PATENT DOCUMENTS

| | | |
|---|---|---|
| CN | 106816460 A | 6/2017 |
| CN | 107768403 A | 3/2018 |

* cited by examiner

… (1) …

DISPLAY PANEL, DISPLAY SCREEN, AND DISPLAY TERMINAL

CROSS-REFERENCES TO RELATED APPLICATIONS

This application is a continuation application of International Application PCT/CN2019/084678, filed on Apr. 26, 2019, which claims priority to Chinese patent application No. 201810887668.0, filed on Aug. 6, 2018, entitled "DISPLAY PANEL, DISPLAY SCREEN, AND DISPLAY TERMINAL", the disclosures of both applications are hereby incorporated by reference in their entirety.

TECHNICAL FIELD

The present disclosure relates to the field of display technologies.

BACKGROUND

With the rapid development of electronic devices, the demand of users for screen-to-body ratio becomes increasingly higher, so that electronic devices with full-screen displays are attracting more and more attention in the industry. As conventional electronic devices, such as mobile phones, tablet PC and the like, require to integrate components such as a front-facing camera, an earphone, and an infrared sensing element and the like, the full-screen display of the electronic device can be achieved by providing a notched area on the display screen and configuring a transparent display screen in the notched area.

SUMMARY

According to various embodiments of the disclosure, a transparent display panel, a display screen, and a display terminal are provided.

A display panel comprises a substrate and a plurality of first electrodes disposed on the substrate. The plurality of first electrodes extend in parallel with each other in an extending direction, and two adjacent first electrodes have an interval therebetween. A width of the first electrode continuously changes or intermittently changes in the extending direction of the first electrode. Two edges of the first electrode in the extending direction are wavy lines, and crests and troughs of the wavy line are both curves, and a radius of curvature of the curve at the crest is different from a radius of curvature of the curve at the trough.

The details of one or more embodiments of this application are set forth in the accompanying drawings and description below. Other features, objects and advantages of this application will become apparent from the description, the accompanying drawings, and the claims.

BRIEF DESCRIPTION OF THE DRAWINGS

To illustrate the technical solutions of the embodiments of this application or the prior art more clearly, the accompanying drawings for describing the embodiments or the prior art are introduced briefly in the following. Apparently, the accompanying drawings in the following description are only some embodiments of this application, and persons of ordinary skill in the art can derive accompany drawings of other embodiments from these accompanying drawings without creative efforts.

DETAILED DESCRIPTION OF THE INVENTION

Figure 1:
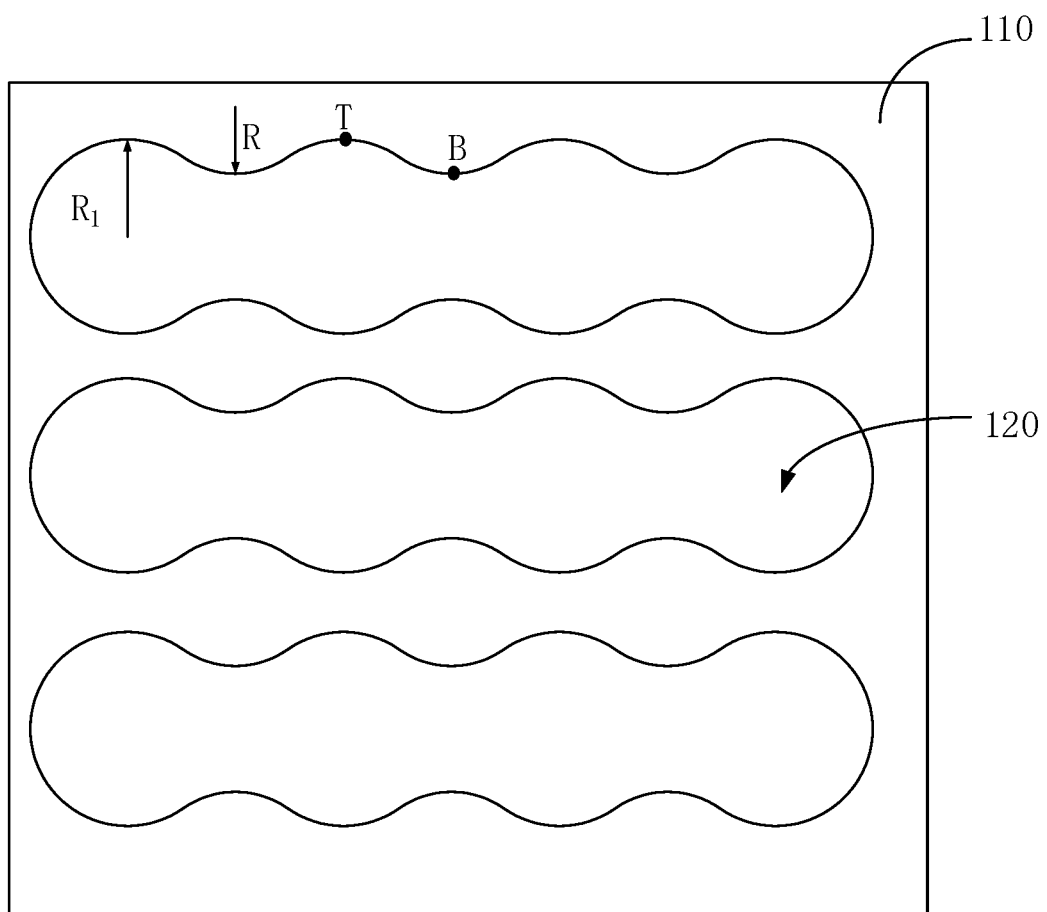
FIG. 1 is a schematic view of a display panel in one embodiment.

Reference will be made to the accompanying drawings and embodiments to describe this application in detail, so that the objects, technical solutions and advantages of this application can be more apparent and understandable. The specific embodiments described herein are only illustrative of this application and are not intended to limit this application.

In the description of this application, orientation or position relationships that are indicated by the terms "center", "transverse", "on", "under", "left", "right", "vertical", "horizontal", "top", "bottom", "inside", and "outside", and the like are orientation or position relationships shown based on the drawings, and are only for convenience of the description of this application and simplifying description, rather than indicating or implying that the indicated device or element must have a particular orientation or being constructed and operated in a particular orientation, and are therefore not to be construed as limitation of this application. Furthermore, when an element is referred to as "formed on another element," it can be directly connected to the other element or a mediating element may be present at the same time. When an element is considered to be "connected" to another element, it can be directly connected to the other element or a mediating element may be present at the same time. Instead, when an element is referred to as being "directly on" another element, there is no intermediate element.

As explained above, when a photosensitive device such as a camera or the like is placed under a transparent display panel, the taken photos are blurred. Applicant's research have found that this problem is due to the presence of the conductive traces in the body of the display screen of the electronic device, and when external light goes through these conductive traces, a complicated diffraction intensity distribution is generated, resulting in diffraction stripes, which would then affect the normal operation of the photosensitive device such as a camera or the like. For example, when a camera under the transparent display area is in operation, an obvious diffraction would occur after the external light goes through the wire material traces within the display screen, so that the picture captured by the camera is distorted.

Usually, conventional conductive traces are strip-shaped. When going through an obstacle such as a slit, a small hole, or a disk, the light will have different degrees of bend-divergence propagation, thus deviating from the original rectilinear propagation. This phenomenon is called diffraction. During diffraction process, the distribution of diffraction stripes is affected by the size of the obstacle, such as the width of the slit, the size of the small hole, and the like. The positions of diffraction stripes generated at positions with the same width are the same, resulting in a relatively obvious diffraction effect. Therefore, when light goes through a conventional display panel, since the display panel has periodically arranged strip-shaped conductive traces, the diffraction stripes generated at different positions have the same position, resulting in a relatively obvious diffraction effect, which is not conducive to the normal operation of the photosensitive device placed under this display panel.

In order to solve the above problem, one embodiment of this application provides a display panel. FIG. 1 is a schematic view of a display panel in one embodiment. This display panel comprises a substrate 110 and a plurality of first electrodes 120 disposed on the substrate.

In one embodiment, the substrate 110 may be a rigid substrate or a flexible substrate. The rigid substrate may be selected as a transparent substrate such as a glass substrate, a quartz substrate, a plastic substrate or the like, and the flexible substrate may be selected as a flexible PI substrate or the like.

The plurality of the first electrodes 120 extend in parallel with each other in an extending direction, and two adjacent first electrodes 120 have an interval therebetween. In this embodiment, two edges of the first electrode 120 in the extending direction are wavy lines, and a width of the first electrode 120 changes continuously in the extending direction of the first electrode 120. The continuous change of the width means that the widths at any two adjacent positions of the first electrode 120 are different. In FIG. 1, the extending direction of the first electrode 120 is a length direction of the first electrode. In this embodiment, the width of the first electrode 120 changes continuously, and the plurality of the first electrodes 120 are regularly arranged on the substrate 110, therefore, gaps between two adjacent first electrodes 120 also present a continuous change in an extending direction parallel to the first electrode 120. The first electrode 120 may periodically change in the extending direction thereof regardless of whether the width continuously changes or intermittently changes, and a length of one change period may correspond to a width of one pixel.

Figure 2:
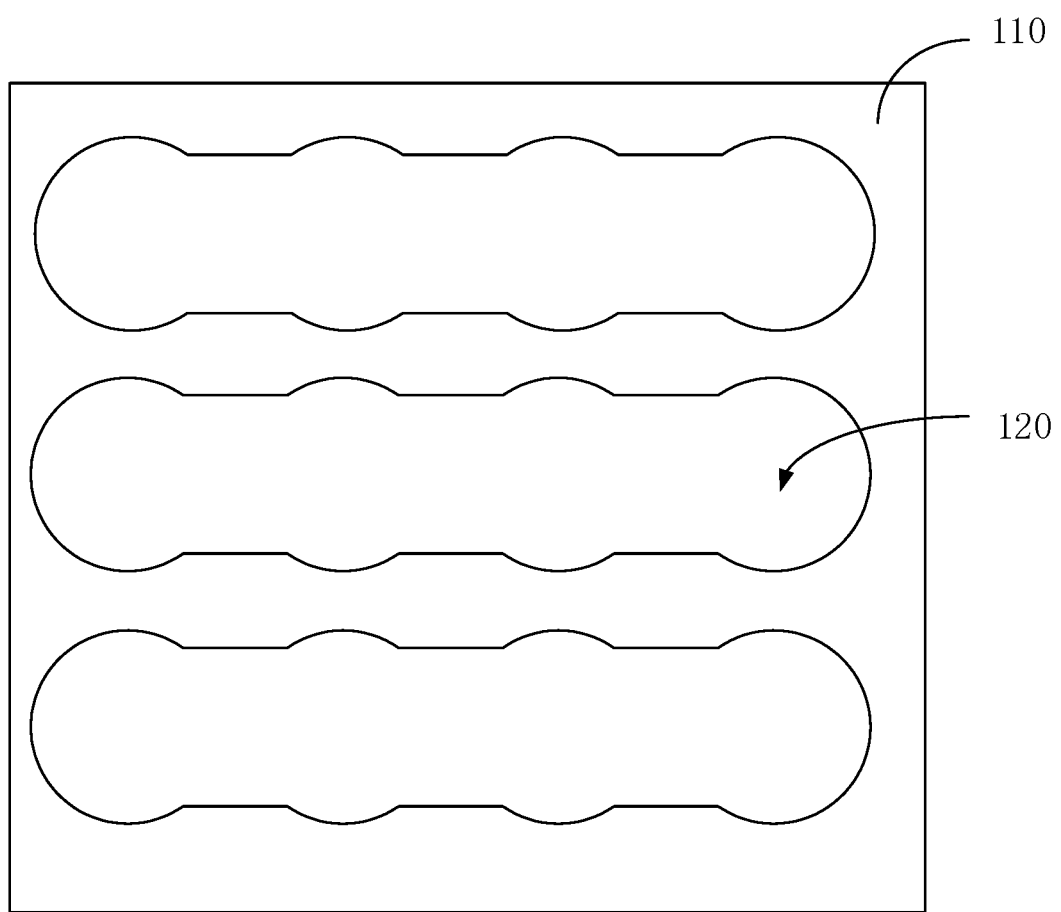
FIG. 2 is a schematic view of a display panel in another embodiment.

In another embodiment, the width of the first electrode 120 changes intermittently in the extending direction, as shown in FIG. 2. The intermittent change of the width means that in the first electrode 120, the widths at two adjacent positions in some areas are the same, while the widths at two adjacent positions in some areas are different. The width of the first electrode 120 changes intermittently, and the plurality of first electrodes 120 are regularly arranged on the substrate 110. Therefore, gaps between two adjacent first electrodes 120 also present an intermittent change in an extending direction parallel to the first electrode 120.

The plurality of first electrodes 120 are disposed in the above-mentioned display panel. The width of the first electrode 120 continuously changes or intermittently changes in the extending direction of the first electrode 120, so that two adjacent first electrodes 120 have continuously changing intervals or intermittently changing intervals therebetween. Therefore, in different width positions of the first electrode 120 and different intervals between two adjacent first electrodes 120, the positions of the generated diffraction stripes are different. The diffraction effects at different positions cancel each other out, so that the diffraction effect may be effectively reduced, and thus ensuring that when a camera is placed under this transparent display panel, the captured photo has a higher definition.

In one embodiment, the first electrode 120 is an axisymmetric pattern. The setting of the width of the first electrode 120 directly affects the pixel aperture in the display panel, thereby affecting the pixel aperture ratio of the display panel. Setting the first electrode 120 as an axisymmetric pattern can ensure that each pixel unit on the display panel can have the same or similar aperture ratio without causing the problem of affecting the display effect of the display panel due to a large difference of the aperture ratios of pixel units at different positions.

As shown in FIG. 1, two edges of the first electrode 120 in the extending direction thereof are wavy lines. Both wavy lines are curves at crest T and trough B, and a radius of curvature of the curve at crest T is different from a radius of curvature of the curve at trough B. Since the radius of curvature of the curve at crest T is different from the radius of curvature of the curve at trough B, the width of the first electrode 120 in the extending direction can be further ensured to change continuously. Therefore, in different width positions of the first electrodes 120 and different intervals between two adjacent first electrodes 120, the positions of the generated diffraction stripes are different. The diffraction effects at different positions cancel each other out, so that the diffraction effect may be effectively reduced, and thus ensuring that when a camera is placed under this display panel, the captured photo has a higher definition.

In one embodiment, the radius of curvature of the curve at each crest T is a first radius $R_1$, then the radius of curvature R of the curve at each trough B satisfies:

$$0.2R_1 \leq R \leq 5R_1.$$

In specific practical application process, the radius of curvature R of the curve at the trough B can be designed according to actual electrical requirements such as resistance requirement of the first electrode 120.

Figure 3:
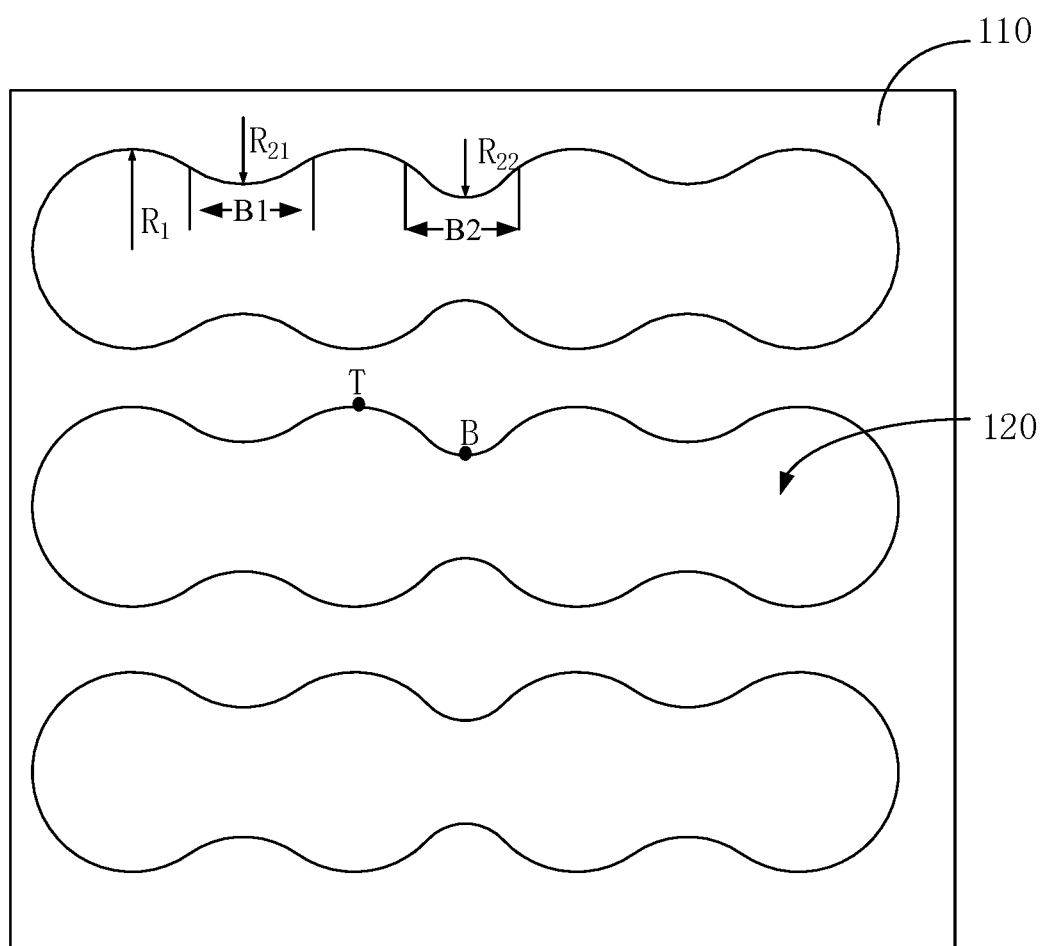
FIG. 3 is a schematic view of a first electrode of a display panel in one embodiment.

In one embodiment, as shown in FIG. 3, the radii of curvature R of the curves at two adjacent troughs B of wavy lines of both edges of the first electrode 120 are different. Specifically, the curves at troughs B of the wavy line comprise at least a first curve B1 and a second curve B2. The radius of curvature of the first curve B1 is $R_{21}$, and the radius of curvature of the second curve B2 is $R_{22}$, and $R_{21} > R_{22}$. The uniformity distribution of width at each position of the first electrode 120 in the extending direction can be further disturbed by setting the radii of the curves at adjacent troughs B to be different, so as to achieve better diffraction improvement effect. In addition, the first curve B1 and the second curve B2 are alternately arranged on the wavy line, which can further disturb the uniformity distribution of width at each position of the first electrode 120, thereby achieving the purpose of improving the diffraction effect.

Figure 4:
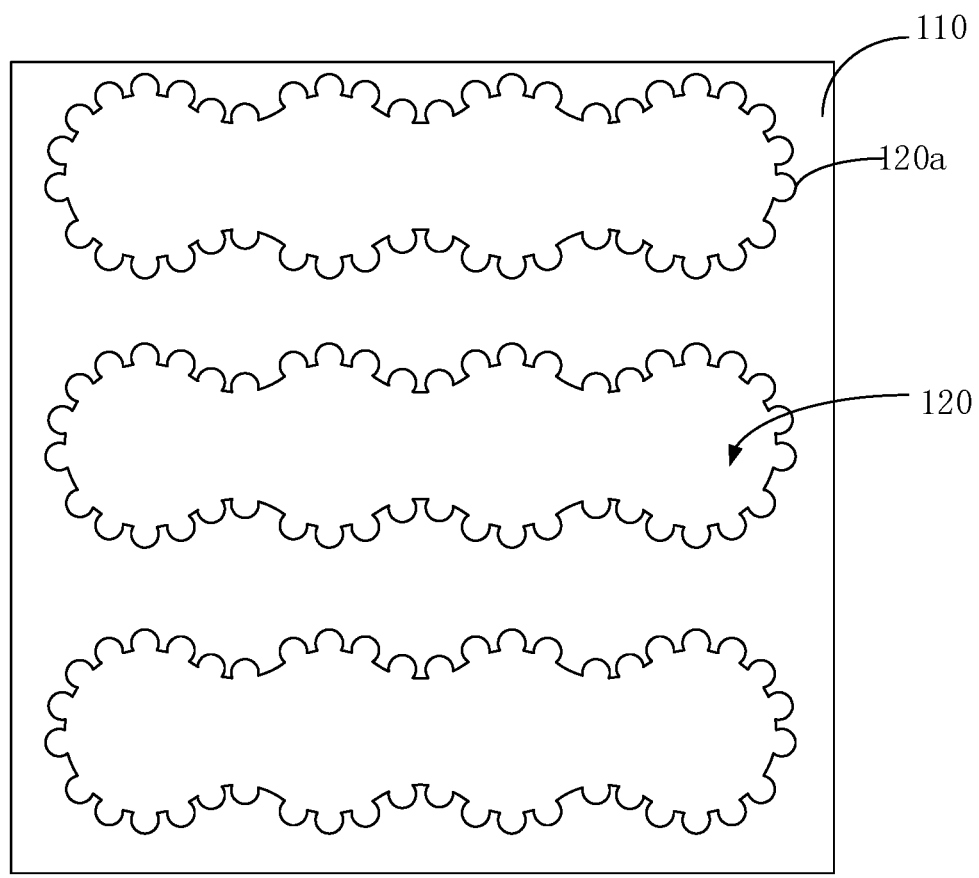
FIG. 4 is a schematic view of a first electrode of a display panel in one embodiment.
Figure 5:
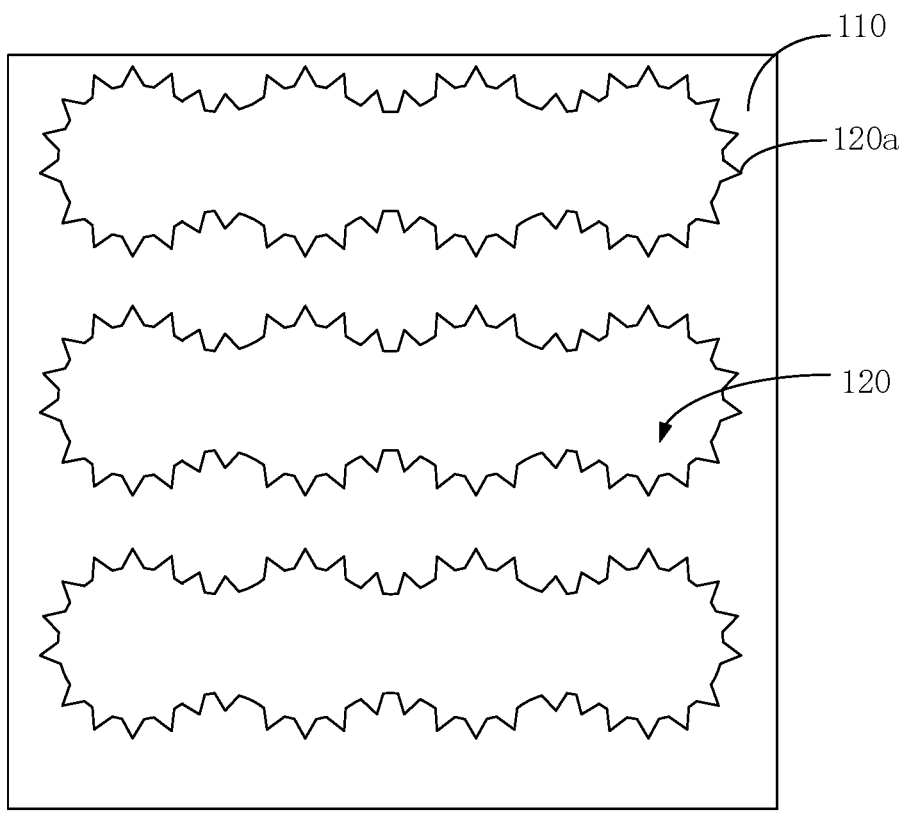
FIG. 5 is a schematic view of a first electrode of a display panel in one embodiment.

In one embodiment, a plurality of protrusions 120a are formed on the first electrode 120. The plurality of protrusions 120a are distributed along all edges of the first electrode 120. The uniformity distribution of width at each position of the first electrode 120 can be further disturbed by setting the plurality of protrusions 120a on the first electrode 120, thereby reducing the diffraction effect. The edge of the protrusion 120a may be a curve and/or a straight line. For example, the edge of the protrusion 120a of the first electrode 120 in FIG. 4 is a curve. The edge of the protrusion 120a of the first electrode 120 in FIG. 5 is a straight line, while the edge of the whole first electrode 120 is serrated.

Figure 6:
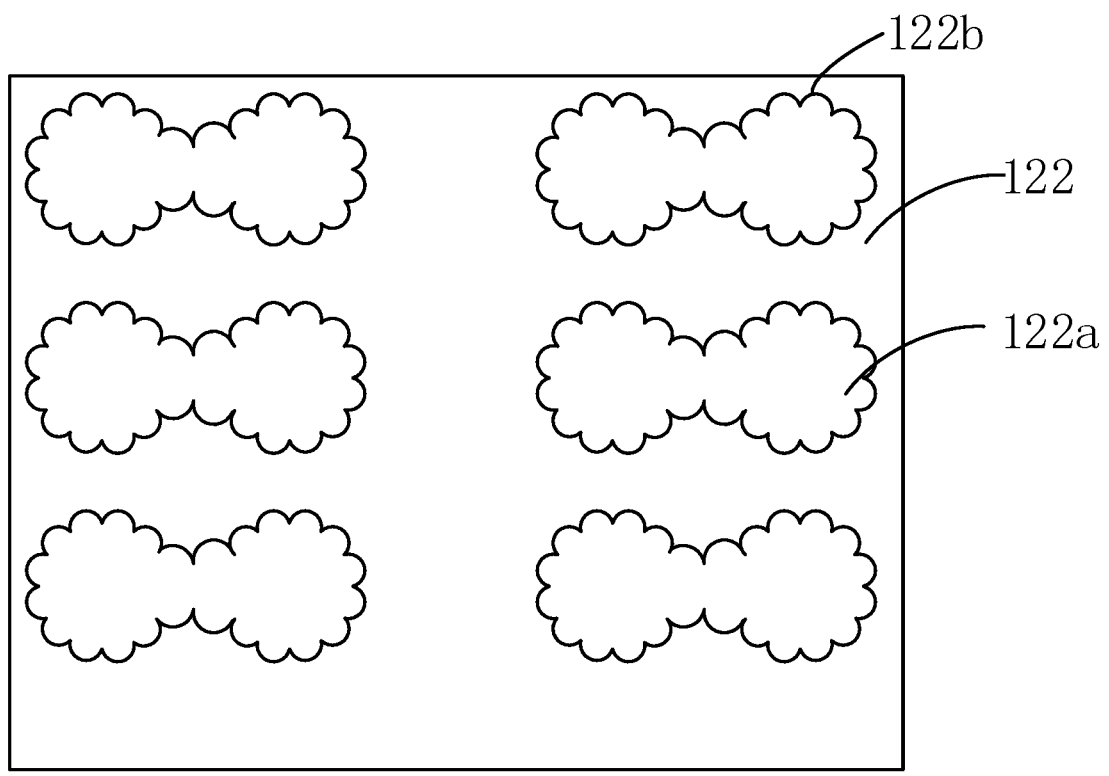
FIG. 6 is a schematic view of a pixel definition layer in one embodiment.

As shown in FIG. 6, in another embodiment, the above-mentioned display panel also comprises a pixel definition layer 122 formed on the first electrode 120. Pixel apertures 122a are formed on the pixel definition layer 122. The edge of each pixel aperture 122a is a non-smooth edge, and a plurality of protrusions 122b are formed on the non-smooth edge. The edge of the protrusion 122b is a straight line and/or a curve. The uniformity distribution of width at each position of pixel aperture 122a can be further disturbed by setting each edge of the pixel aperture 122a as the non-smooth edge, thereby reducing the diffraction effect.

Figure 7:
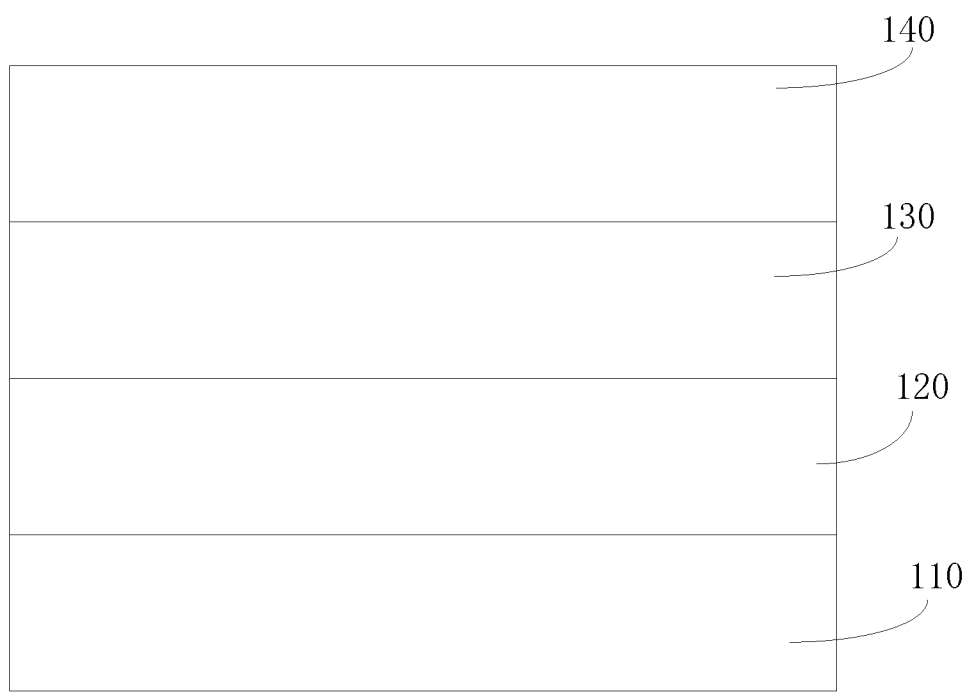
FIG. 7 is a side view of a PMOLED display panel in one embodiment.

In one embodiment, as shown in FIG. 7, the display panel may further comprise a second electrode 140 stacked with the first electrode 120, and an extending direction of the second electrode 140 is perpendicular to the extending direction of the first electrode 120.

In one embodiment, in order to improve light transmittance of the display panel, each of the conductive traces of the display panel, such as the first electrode 120 and the second electrode 140, is made of transparent conductive metal oxide. For example, the first electrode 120 and the second electrode 140 may be made of indium tin oxide (ITO) or indium zinc oxide (IZO). Furthermore, in order to reduce the resistance of each conductive trace while ensuring high light transmittance, the first electrode 120 and the second electrode 140 may also be made of materials such as aluminum-doped zinc oxide, silver-doped ITO or silver-doped IZO.

In one embodiment, the above-mentioned display panel is a Passive-Matrix Organic Light-Emitting Diode (PMOLED) display panel. As shown in FIG. 7, this display panel also comprises the second electrode 140 stacked with the first electrode 120. An insulating layer 130 is formed between the first electrode 120 and the second electrode 140. The insulating layer 130 serves to achieve electrical insulation between the first electrode 120 and the second electrode 140. This insulating layer 130 can be an inorganic insulating layer or an organic insulating layer, and also can be a composite structure including both an organic layer and an inorganic layer. In order to increase light transmittance of the display panel, the insulating layer is preferably made of $SiO_2$, $SiN_x$, $Al_2O_3$ or the like.

The extending direction of the second electrode 140 is perpendicular to the extending direction of the first electrode 120, thereby forming a light emitting region of the display panel in the overlapping region. Wherein the first electrode 120 is an anode and the second electrode 140 is a cathode. In this embodiment, each anode serves to drive one row/column or multi-row/multi-column sub-pixels. Generally, one pixel (or pixel unit) comprises at least three sub-pixels of red, green and blue. In other embodiments, one pixel unit may comprise four sub-pixels of red, green, blue and white. The arrangement mode of sub-pixels may be RGB sub-pixel parallel arrangement, V-type arrangement, and PenTile arrangement and the like. In this application, the pixel units arranged in RGB sub-pixels are illustrated as examples. The display panel in this embodiment may also be applied to other arrangement modes besides RGB sub-pixel arrangement. In one embodiment, each anode serves to drive all of sub-pixels in one row/column pixel unit. That is, in this embodiment, each anode serves to drive three columns of sub-pixels of red, green and blue in one row/column pixel unit.

In one embodiment, the second electrode 140, i.e., the cathode, has the same shape as the first electrode 120. Specifically, the width of the second electrode 140 continuously changes or intermittently changes in the extending direction, so that two adjacent second electrodes 140 have continuously changing intervals or intermittently changing intervals therebetween. Therefore, in different width positions of the second electrodes 140 and different intervals between two adjacent second electrodes 140, the positions of the generated diffraction stripes are different. The diffraction effects at different positions cancel each other out, so that the diffraction effect may be effectively reduced, and thus ensuring that when a camera is placed under this transparent display panel, the captured photo has a higher definition.

In another embodiment, the above-mentioned display panel may also be an Active Matrix Organic Light-Emitting Diode (AMOLED) display panel. At this time, the substrate 110 is a TFT array substrate. The first electrode 120 comprises various conductive traces formed on the TFT array substrate. The width dimension of the first electrode 120 is designed according to the design of width of the conductive trace. Wherein the conductive traces comprise at least one of the group consisting of a scanning wire, a data wire, and a power wire. For example, all of conductive traces on the TFT array substrate such as a scanning wire, a data wire, and a power wire can be modified to adopt the shape of the electrode as shown in FIG. 3. By adopting the wavy shape of the electrode of FIG. 3 for the conductive traces on the TFT array substrate, it may be ensured that in an extending direction of the conductive trace when the light goes through different width positions and different gaps between adjacent traces, diffraction stripes with different positions can be generated. The diffraction effects at different positions cancel each other out, so that the diffraction effect is reduced, thereby the photosensitive device placed under the display panel can work normally.

Figure 8:
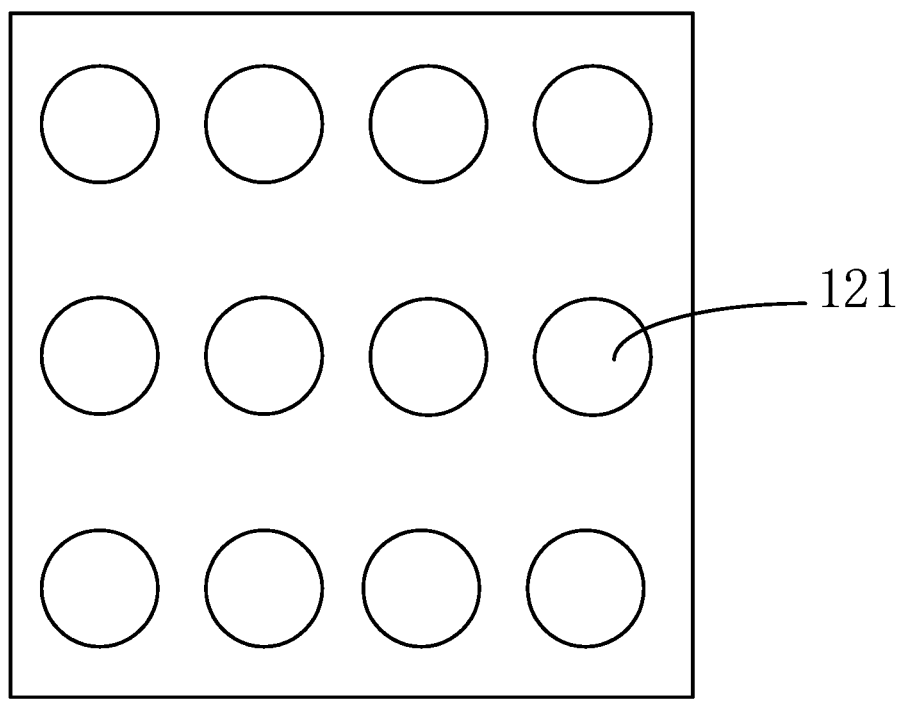
FIG. 8 is a schematic view of an anode in an AMOLED display panel in one embodiment.
Figure 9:
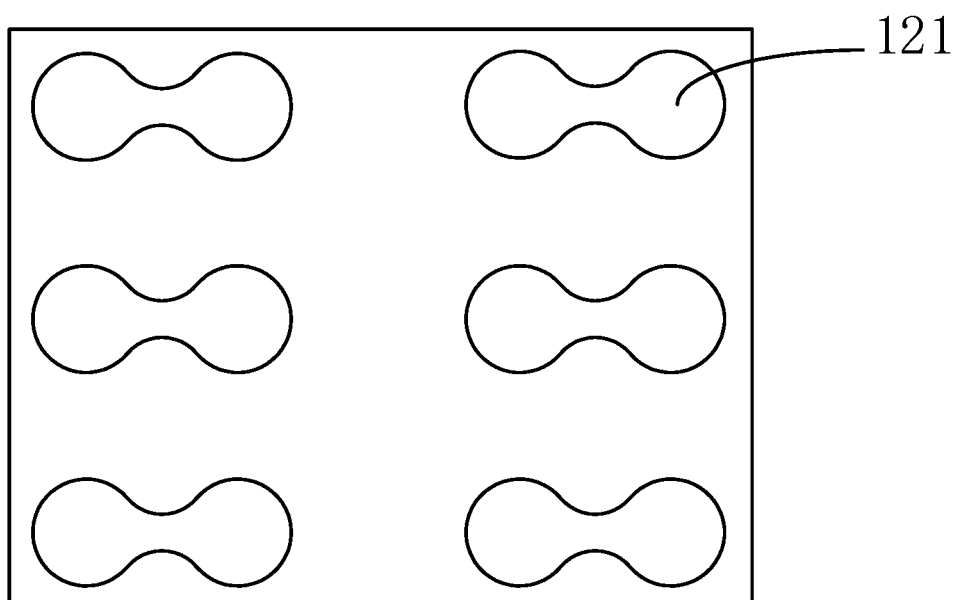
FIG. 9 is a schematic view of an anode in an AMOLED display panel in another embodiment.

In one embodiment, the display panel is an AMOLED display panel, and further comprises an anode layer formed on the substrate 110. The anode layer comprises a plurality of mutually independent anodes arranged in an array. The anode may be circular, elliptical or dumbbell in shape. FIG. 8 is a schematic view of an anode layer adopting circular anodes 121 arrangement. FIG. 9 is a schematic view of an anode layer adopting dumbbell shaped anodes 121 arrangement. By changing the anode 121 to be circular, elliptical or dumbbell in shape, it may be ensured that when light goes through the anode layer, diffraction stripes having different positions and diffusion directions can be generated at different width positions of the anode 121. The diffraction stripes at different positions and directions cancel each other out, so that the diffraction effect is reduced. Furthermore, each sub-pixel may also be arranged to be circular, elliptical or dumbbell in shape to reduce the diffraction effect.

In one embodiment, the above-mentioned display panel may be a transparent or transflective display panel.

The transparency of the display panel can also be achieved by other technical means, and structures of the above-mentioned display panels can be applicable. When the transparent or transflective display panel is in a working state, the picture can be displayed normally, and when the display panel is in a state of other functional requirements, the external light can go through the display panel and irradiate to the photosensitive device or the like placed under the display panel.

Figure 10:
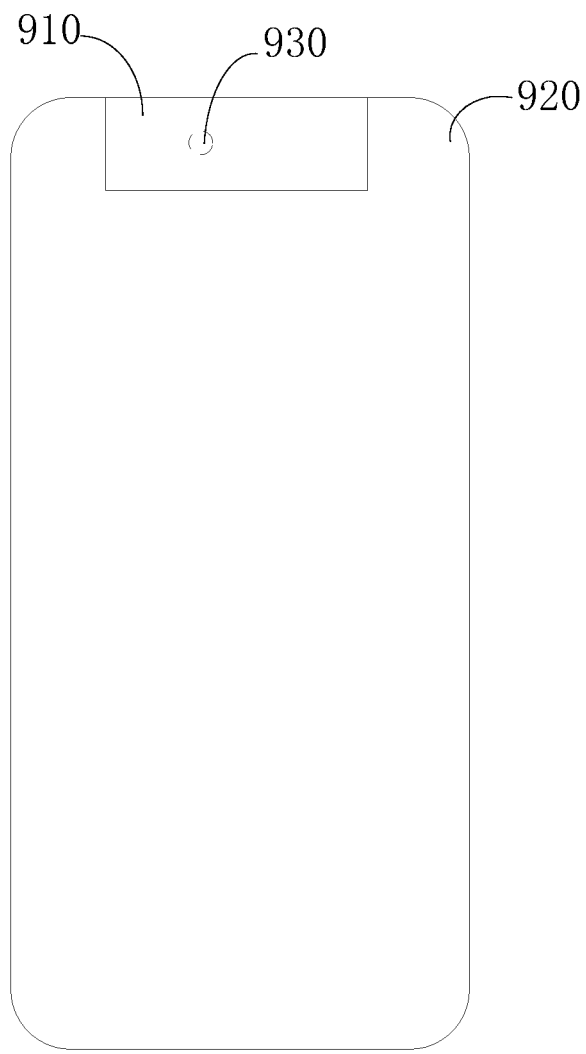
FIG. 10 is a schematic view of a display screen in one embodiment.

One embodiment of this application also provides a display screen. FIG. 10 is a schematic view of a display screen in one embodiment, and this display screen comprises a first display area 910 and a second display area 920. Light transmittance of the first display area 910 is greater than that of the second display area 920. A photosensitive device 930 may be placed under the first display area 910. The first display area 910 is provided with a first display panel which is a display panel as mentioned in any of the foregoing embodiments. The second display area 920 is provided with a second display panel. The first display area 910 and the second display area 920 both serve to display static or dynamic pictures. Since the first display area 910 adopts the display panel in the foregoing embodiments, when light goes through this display area, no obvious diffraction effect is generated, so that the photosensitive device 930 located under the first display area 910 can be ensured to work normally.

When the photosensitive device 930 is not in operation, the first display area 910 can normally display dynamic or static pictures, and when the photosensitive device 930 is in operation, the first display area 910 is changed as the display content of the overall display screen changes, such as displaying the external photo being captured. Alternatively, the first display area 910 may also be in a non-display state, so as to further ensure that the photosensitive device 930 can perform light collection normally through this display panel. In other embodiments, the light transmittance of the first display area 910 and the light transmittance of the second display area 920 may be the same, so that the entire display panel has better light transmittance uniformity, ensuring that the display panel has a better display effect.

In one embodiment, the first display panel provided in the first display area 910 is a PMOLED display panel or an AMOLED display panel, and the second display panel provided in the second display area 920 is an AMOLED display panel, thereby forming a full-screen composed of a PMOLED display panel and an AMOLED display panel.

Figure 11:
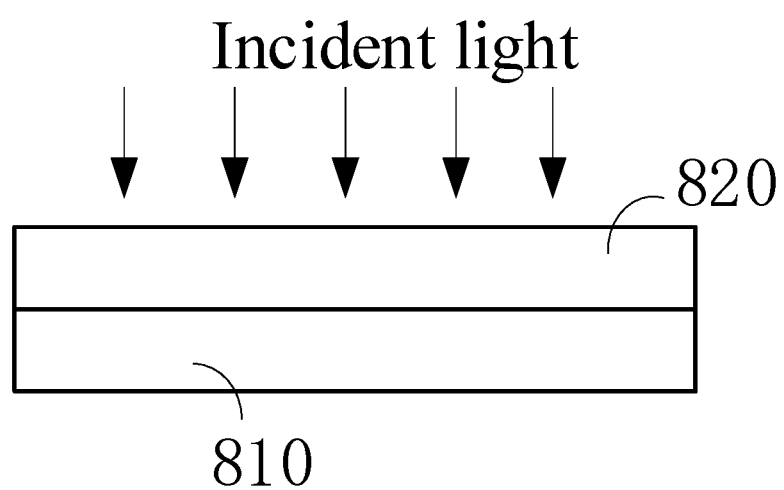
FIG. 11 is a schematic view of a display terminal in one embodiment.

Another embodiment of this application further provides a display terminal. FIG. 11 is a schematic view of a display terminal in one embodiment, and this display terminal comprises a device body 810 and a display screen 820. The display screen 820 is disposed on the device body 810 and is interconnected with the device body 810. Wherein the display screen 820 can adopt the display screen in any of the foregoing embodiments to display a static or dynamic picture.

Figure 12:
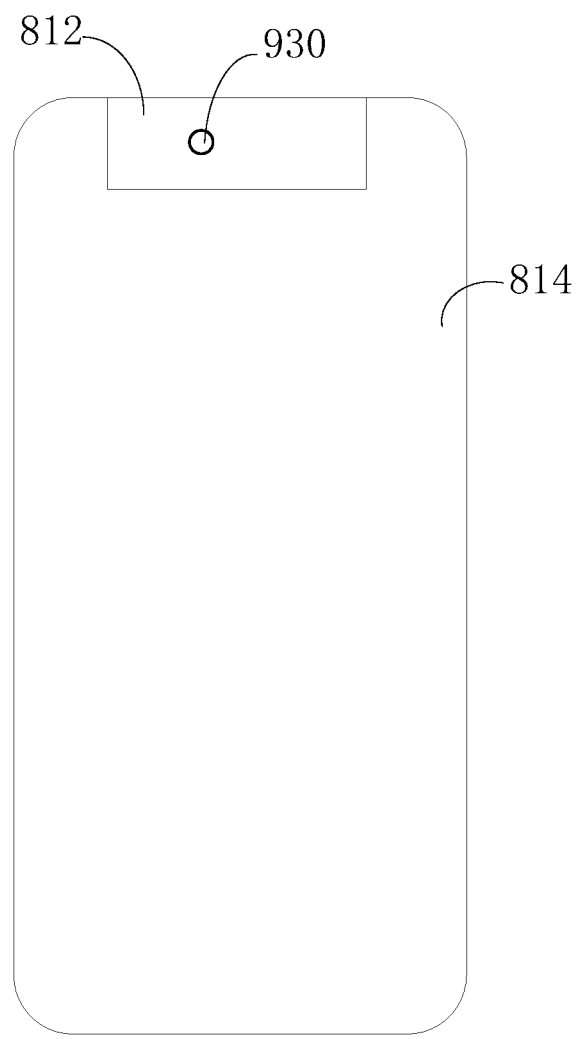
FIG. 12 is a schematic view of a device body in one embodiment.

FIG. 12 is a schematic view of the device body 810 in one embodiment. In this embodiment, the device body 810 may be provided with a notched area 812 and a non-notched area 814. Photosensitive devices such as a camera 930 and an optical sensor and the like may be provided in the notched area 812. At this time, the display panel of the first display area of the display screen 820 is attached to the notched area 812, so that the above-mentioned photosensitive devices such as the camera 930 and the optical sensor and the like can perform operations such as external light collection and the like through the first display area. Since the display panel in the first display area can effectively improve the diffraction phenomenon generated by the transmission of the external light through this first display area, the quality of the photo captured by the camera 930 on the display device may be effectively improved, and the distortion of the captured photo due to diffraction is avoided, while the accuracy and sensitivity of the optical sensor to sense external light are also improved.

The above-mentioned electronic devices may be mobile phones, tablet PC, PDA, iPod and other digital devices.

The technical features of the above-described embodiments may be combined arbitrarily. In order to simplify the description, not all the possible combinations of the technical features in the above embodiments are described. However, all of the combinations of these technical features should be considered as within the scope of this disclosure, as long as such combinations do not contradict with each other.

The above embodiments merely illustrates several embodiments of this application, and the description thereof is specific and detailed, but it shall not be constructed as limiting the scope of the application. It should be noted that, for a person of ordinary skill in the art, several variations and improvements may be made without departing from the concept of this disclosure, and these are all within the protection scope of this disclosure. Therefore, the protection scope of this application shall be subject to the appended claims.

The invention claimed is:

1. A display panel, comprising:
   a substrate; and
   a first plurality of electrodes disposed on the substrate, the electrodes of the first plurality of electrodes extending in parallel with one another along an extending direction, and two adjacent electrodes of the first plurality of electrodes having an interval therebetween;
   wherein, a width of a first electrode of the first plurality of electrode changes continuously or intermittently in the extending direction of the first electrodes, two edges of the first electrode in the extending direction thereof conform into wavy lines, a plurality of crests of the wave lines conforms to a first curve, a plurality of troughs of the wavy lines conforms to a second curve, and a radius of curvature of the first curve is different from a radius of curvature of the second curve.

2. The display panel according to claim 1, wherein the radius of curvature of the first curve is a first radius R1, and the radius of curvature R of the second curve satisfies:

$$0.2R1 \leq R \leq 5R1.$$

3. The display panel according to claim 1, wherein radii of curvature of the curve at two adjacent troughs of the plurality of troughs are different.

4. The display panel according to claim 1, wherein the curves at the plurality of troughs comprise at least a first curve and a second curve, the first curve and the second curve being alternately arranged on the wavy line.

5. The display panel according to claim 1, wherein the display panel is a PMOLED display panel.

6. The display panel according to claim 1, further comprising a second electrode stacked with the first electrode, wherein an extending direction of the second electrode is perpendicular to the extending direction of the first electrode.

7. The display panel according to claim 6, wherein the first electrode is an anode and the second electrode is a cathode.

8. The display panel according to claim 7, wherein the shape of the cathode is same as the shape of the anode.

9. The display panel according to claim 6, wherein the second electrode comprises at least one kind of material selected from the group consisting of indium tin oxide, indium zinc oxide, silver-doped indium tin oxide, and silver-doped indium zinc oxide.

10. The display panel according to claim 1, wherein the display panel is an AMOLED display panel.

11. The display panel according to claim 10, wherein the display panel further comprises an anode layer disposed on the substrate, the anode layer comprising a plurality of mutually independent anodes arranged in an array, and the anode is circular, elliptical or dumbbell in shape.

12. The display panel according to claim 1, wherein the substrate is a Thin Film Transistor array substrate.

13. The display panel according to claim 12, wherein the first electrode comprises a conductive trace disposed on the Thin Film Transistor array substrate, and the conductive trace being at least one selected from the group consisting of a scanning wire, a data wire, and a power wire.

14. The display panel according to claim 1, wherein the first electrode comprises a plurality of protrusions distributed along all edges of the first electrode.

15. The display panel according to claim 1, wherein the display panel comprises a material having a light transmittance greater than 90%.

16. The display panel according to claim 1, wherein the first electrode comprises at least one kind of material selected from the group consisting of indium tin oxide, indium zinc oxide, silver-doped indium tin oxide, and silver-doped indium zinc oxide.

17. A display screen, comprising:
 a first display area displaying a picture; and
 a first display panel according to claim 1 disposed in the first display area.

18. The display screen according to claim 17, further comprising a second display area adjacent to the first display area, and a second display panel disposed on the second display area, the first display panel being a PMOLED display panel or an AMOLED display panel, and the second display panel being an AMOLED display panel.

19. A display terminal, comprising:
 a device body having a device area; and
 a display screen according to claim 17 covering the device body;
 wherein the device area is located under the first display area, and a photosensitive device collecting light through the first display area being disposed in the device area.

20. The display terminal according to claim 19, wherein the device area is a notched area and the photosensitive device is a camera or a light sensor.

* * * * *